(12) United States Patent
Takagi et al.

(10) Patent No.: US 11,482,555 B2
(45) Date of Patent: Oct. 25, 2022

(54) SEMICONDUCTOR DEVICE AND METHOD FOR MANUFACTURING SEMICONDUCTOR DEVICE

(71) Applicant: HAMAMATSU PHOTONICS K.K., Hamamatsu (JP)

(72) Inventors: Shin-ichiro Takagi, Hamamatsu (JP); Yasuhito Yoneta, Hamamatsu (JP); Masaharu Muramatsu, Hamamatsu (JP); Nao Inoue, Hamamatsu (JP); Hirokazu Yamamoto, Hamamatsu (JP); Shinichi Nakata, Hamamatsu (JP); Takuo Koyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/963,291

(22) PCT Filed: Nov. 27, 2018

(86) PCT No.: PCT/JP2018/043617
§ 371 (c)(1),
(2) Date: Jul. 20, 2020

(87) PCT Pub. No.: WO2019/146244
PCT Pub. Date: Aug. 1, 2019

(65) Prior Publication Data
US 2021/0057477 A1     Feb. 25, 2021

(30) Foreign Application Priority Data
Jan. 25, 2018   (JP) .............................. JP2018-010709

(51) Int. Cl.
*H01L 31/00*     (2006.01)
*H01L 27/146*    (2006.01)
(Continued)

(52) U.S. Cl.
CPC ...... *H01L 27/14634* (2013.01); *H01L 21/563* (2013.01); *H01L 23/3185* (2013.01);
(Continued)

(58) Field of Classification Search
CPC ......... H01L 23/12; H01L 23/15; H01L 23/29; H01L 23/31; H01L 23/498; H01L 23/538;
(Continued)

(56) References Cited

U.S. PATENT DOCUMENTS

2002/0044213 A1   4/2002   Shinomiya et al.
2002/0060368 A1   5/2002   Jiang
(Continued)

FOREIGN PATENT DOCUMENTS

JP   H08-264587 A   10/1996
JP   H09-266210 A   10/1997
(Continued)

OTHER PUBLICATIONS

International Preliminary Report on Patentability dated Aug. 6, 2020 for PCT/JP2018/043617.

*Primary Examiner* — Chuong A Luu
(74) *Attorney, Agent, or Firm* — Faegre Drinker Biddle & Rearh LLP (57) ABSTRACT

A semiconductor device includes a support body including a mount region, a semiconductor chip disposed on the mount region with a predetermined distance therebetween, a bump disposed between the support body and the semiconductor chip, a wall portion disposed between the support body and the semiconductor chip along a part of an outer edge of the semiconductor chip, and an underfill resin layer disposed between the support body and the semiconductor chip. The underfill resin layer covers an outer side surface of the wall portion.

10 Claims, 10 Drawing Sheets

(51) Int. Cl.
*H01L 21/56* (2006.01)
*H01L 23/31* (2006.01)
*H01L 23/00* (2006.01)

(52) U.S. Cl.
CPC .......... *H01L 24/16* (2013.01); *H01L 27/1469* (2013.01); *H01L 27/14636* (2013.01); *H01L 2224/16145* (2013.01); *H01L 2924/18161* (2013.01)

(58) Field of Classification Search
CPC ........... H01L 23/49894; H01L 23/5389; H01L 23/3128; H01L 23/3157; H01L 23/3192; H01L 23/3142; H01L 23/3185; H01L 27/146; H01L 27/1469; H01L 27/14636; H01L 25/07; H01L 25/065; H01L 25/074; H01L 25/18; H01L 25/0657; H01L 21/56; H01L 21/563; H01L 21/565; H01L 21/566; H01L 23/16; H01L 23/26
USPC ........................................................ 257/459
See application file for complete search history.

(56) References Cited

U.S. PATENT DOCUMENTS

| | | | |
|---|---|---|---|
| 2003/0201462 A1* | 10/2003 | Pommer | G02B 6/4201 257/200 |
| 2006/0163749 A1 | 7/2006 | Lee et al. | |
| 2009/0230409 A1* | 9/2009 | Basin | H01L 24/97 257/88 |
| 2010/0255641 A1* | 10/2010 | Nakanishi | H01L 25/105 438/127 |
| 2011/0204476 A1 | 8/2011 | Kang et al. | |
| 2012/0098091 A1* | 4/2012 | Ikemoto | H01L 23/49822 257/532 |
| 2013/0264599 A1 | 10/2013 | Kikuchi et al. | |
| 2015/0001717 A1 | 1/2015 | Karhade et al. | |
| 2018/0358501 A1* | 12/2018 | Huang | A61B 5/25 |

FOREIGN PATENT DOCUMENTS

| | | |
|---|---|---|
| JP | H11-163048 A | 6/1999 |
| JP | 2002-170848 A | 6/2002 |
| JP | 2002-198384 A | 7/2002 |
| JP | 2004-039886 A | 2/2004 |
| JP | 2005-276879 A | 10/2005 |
| JP | 2007-103772 A | 4/2007 |
| JP | 2013-008963 A | 1/2013 |
| JP | 2015-185567 A | 10/2015 |
| TW | I339426 B | 3/2011 |

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND ART

Regarding a semiconductor device in which a second semiconductor chip is mounted in a mount region of a first semiconductor chip, a semiconductor device having an underfill resin layer disposed between the first semiconductor chip and the second semiconductor chip which are joined to each other with a bump is known. When such a semiconductor device is manufactured, in order to reliably dispose an underfill resin layer between the first semiconductor chip and the second semiconductor chip, a vacuum filling method may be used (for example, refer to Patent Literature 1).

In a vacuum filling method, an underfill resin agent is annularly disposed in a mount region of a first semiconductor chip along an outer edge of a second semiconductor chip in a vacuum environment, and a closed space is formed between the first semiconductor chip and the second semiconductor chip. Thereafter, a region corresponding to the closed space is filled with the underfill resin agent by releasing it in an atmospheric pressure environment, and an underfill resin layer is formed between the first semiconductor chip and the second semiconductor chip by hardening the underfill resin agent.

CITATION LIST

Patent Literature

[Patent Literature 1] Japanese Unexamined Patent Publication No. H8-264587

SUMMARY OF INVENTION

Technical Problem

However, when such a semiconductor device described above is manufactured, in a case in which a vacuum filling method is used for reliable disposition of an underfill resin layer, there is concern that size reduction of the device may be hindered. The reason therefor is that a mount region of a first semiconductor chip has to be widened along the entire part of an outer edge of a second semiconductor chip in order to annularly dispose an underfill resin agent in the mount region of the first semiconductor chip along the outer edge of the second semiconductor chip.

An object of the present disclosure is to provide a semiconductor device in which improvement in reliability and size reduction are achieved and a method for manufacturing such a semiconductor device.

Solution to Problem

According to an aspect of the present disclosure, there is provided a semiconductor device including a support body including a mount region, a semiconductor chip disposed on the mount region with a predetermined distance therebetween, a bump disposed between the support body and the semiconductor chip, a wall portion disposed between the support body and the semiconductor chip along a part of an outer edge of the semiconductor chip, and an underfill resin layer disposed between the support body and the semiconductor chip. The underfill resin layer covers an outer side surface of the wall portion.

In this semiconductor device, for example, when a vacuum filling method is used during manufacturing, a closed space can be formed between the support body and the semiconductor chip with the wall portion disposed along the part of the outer edge of the semiconductor chip and an underfill resin agent disposed along a remaining part of the outer edge of the semiconductor chip excluding the part. Accordingly, there is no need to widen the mount region of the support body along the part of the outer edge of the semiconductor chip. Therefore, in this semiconductor device, reliable disposition of the underfill resin layer and size reduction of the device are realized. Moreover, in this semiconductor device, the underfill resin layer covers the outer side surface of the wall portion. Therefore, curbing of deterioration in the wall portion and improvement in joining strength between the support body and the semiconductor chip are realized. As described above, according to this semiconductor device, improvement in reliability and size reduction are achieved.

In the semiconductor device according to the aspect of the present disclosure, the underfill resin layer may cover the entire outer side surface of the wall portion. According to this configuration, curbing of deterioration in the wall portion and improvement in joining strength between the support body and the semiconductor chip are realized more reliably.

In the semiconductor device according to the aspect of the present disclosure, a material of the wall portion may be the same as a material of the bump. According to this configuration, damage or the like caused by a difference between thermal expansion coefficients of the bump and the wall portion is curbed. In addition, the bump and the wall portion are easily formed.

In the semiconductor device according to the aspect of the present disclosure, the outer side surface of the wall portion may be positioned on an inward side of the part of the outer edge of the semiconductor chip when viewed in a direction in which the support body and the semiconductor chip face each other. According to this configuration, a groove having the outer side surface of the wall portion as a bottom surface is formed along the part of the outer edge of the semiconductor chip. Therefore, a part of the underfill resin layer covering the outer side surface of the wall portion is stabilized, and a protruding amount of the part contributing to size reduction is further reduced.

In the semiconductor device according to the aspect of the present disclosure, the underfill resin layer may include a first fillet portion disposed on the mount region along the part of the outer edge of the semiconductor chip, the first fillet portion being positioned on an outward side of the part, and a second fillet portion disposed on the mount region along a remaining part of the outer edge of the semiconductor chip excluding the part, the second fillet portion being positioned on an outward side of the remaining part. A width of the first fillet portion may be narrower than a width of the second fillet portion. According to this configuration, while size reduction of the device is maintained, improvement in joining balance and joining strength between the support body and the semiconductor chip is realized.

In the semiconductor device according to the aspect of the present disclosure, the first fillet portion and the second fillet portion may lead to a side surface of the semiconductor chip. According to this configuration, improvement in joining balance and joining strength between the support body and the semiconductor chip is realized more reliably.

In the semiconductor device according to the aspect of the present disclosure, the support body may further include a light receiving region adjacent to the mount region. The part of the outer edge of the semiconductor chip may be a part extending along the light receiving region. According to this configuration, the semiconductor chip and the light receiving region can be disposed close to each other.

The semiconductor device according to the aspect of the present disclosure may further include a different semiconductor chip adjacent to the semiconductor chip in the mount region. The part of the outer edge of the semiconductor chip may be a part extending along the different semiconductor chip. According to this configuration, the semiconductor chip and the different semiconductor chip can be disposed close to each other.

In the semiconductor device according to the aspect of the present disclosure, the support body may further include a terminal region adjacent to the mount region. The part of the outer edge of the semiconductor chip may be a part extending along the terminal region. According to this configuration, the semiconductor chip and the terminal region can be disposed close to each other.

According to another aspect of the present disclosure, there is provided a method for manufacturing a semiconductor device including a first step of disposing a semiconductor chip on a mount region included in a support body with a predetermined distance therebetween, and joining the support body and the semiconductor chip to each other with a bump disposed between the support body and the semiconductor chip and a wall portion disposed between the support body and the semiconductor chip along a part of an outer edge of the semiconductor chip, a second step of disposing an underfill resin agent on the mount region along a remaining part of the outer edge of the semiconductor chip excluding the part to be positioned on an outward side of the remaining part in an environment of a first atmospheric pressure, and forming a closed space between the support body and the semiconductor chip with the wall portion and the underfill resin agent, and a third step of filling a region corresponding to the closed space with the underfill resin agent by disposition in an environment of a second atmospheric pressure higher than the first atmospheric pressure, and disposing an underfill resin layer between the support body and the semiconductor chip by hardening the underfill resin agent.

In this method for manufacturing a semiconductor device, a closed space is formed between the support body and the semiconductor chip with the wall portion disposed along the part of the outer edge of the semiconductor chip and the underfill resin agent disposed along the remaining part of the outer edge of the semiconductor chip excluding the part. Accordingly, there is no need to widen the mount region of the support body along the part of the outer edge of the semiconductor chip. Thus, according to this method for manufacturing a semiconductor device, it is possible to obtain a semiconductor device in which improvement in reliability and size reduction of the device are realized.

Advantageous Effects of Invention

According to the present disclosure, it is possible to provide a semiconductor device in which improvement in reliability and size reduction are achieved and a method for manufacturing such a semiconductor device.

BRIEF DESCRIPTION OF DRAWINGS

(a) of FIG. 3 is a plan view illustrating a step of a method for manufacturing the semiconductor device illustrated in FIG. 1. (b) of FIG. 3 is a cross-sectional view illustrating a step of the method for manufacturing the semiconductor device illustrated in FIG. 1.

(a) of FIG. 4 is a plan view illustrating a step of the method for manufacturing the semiconductor device illustrated in FIG. 1. (b) of FIG. 4 is a cross-sectional view illustrating a step of the method for manufacturing the semiconductor device illustrated in FIG. 1.

(a) of FIG. 5 is a plan view illustrating a step of the method for manufacturing the semiconductor device illustrated in FIG. 1. (b) of FIG. 5 is a cross-sectional view illustrating a step of the method for manufacturing the semiconductor device illustrated in FIG. 1.

(a) of FIG. 6 is a plan view illustrating a step of the method for manufacturing the semiconductor device illustrated in FIG. 1. (b) of FIG. 6 is a cross-sectional view illustrating a step of the method for manufacturing the semiconductor device illustrated in FIG. 1.

(a) and (b) of FIG. 7 are cross-sectional views of a part of a semiconductor device according to another embodiment.

(a), (b), and (c) of FIG. 10 are plan views of the semiconductor device according to another embodiment.

DESCRIPTION OF EMBODIMENT

Hereinafter, an embodiment of the present disclosure will be described in detail with reference to the drawings. In each diagram, the same reference signs are applied to parts which are the same or corresponding, and duplicate description thereof will be omitted.

[Configuration of Semiconductor Device]

Figure 1:
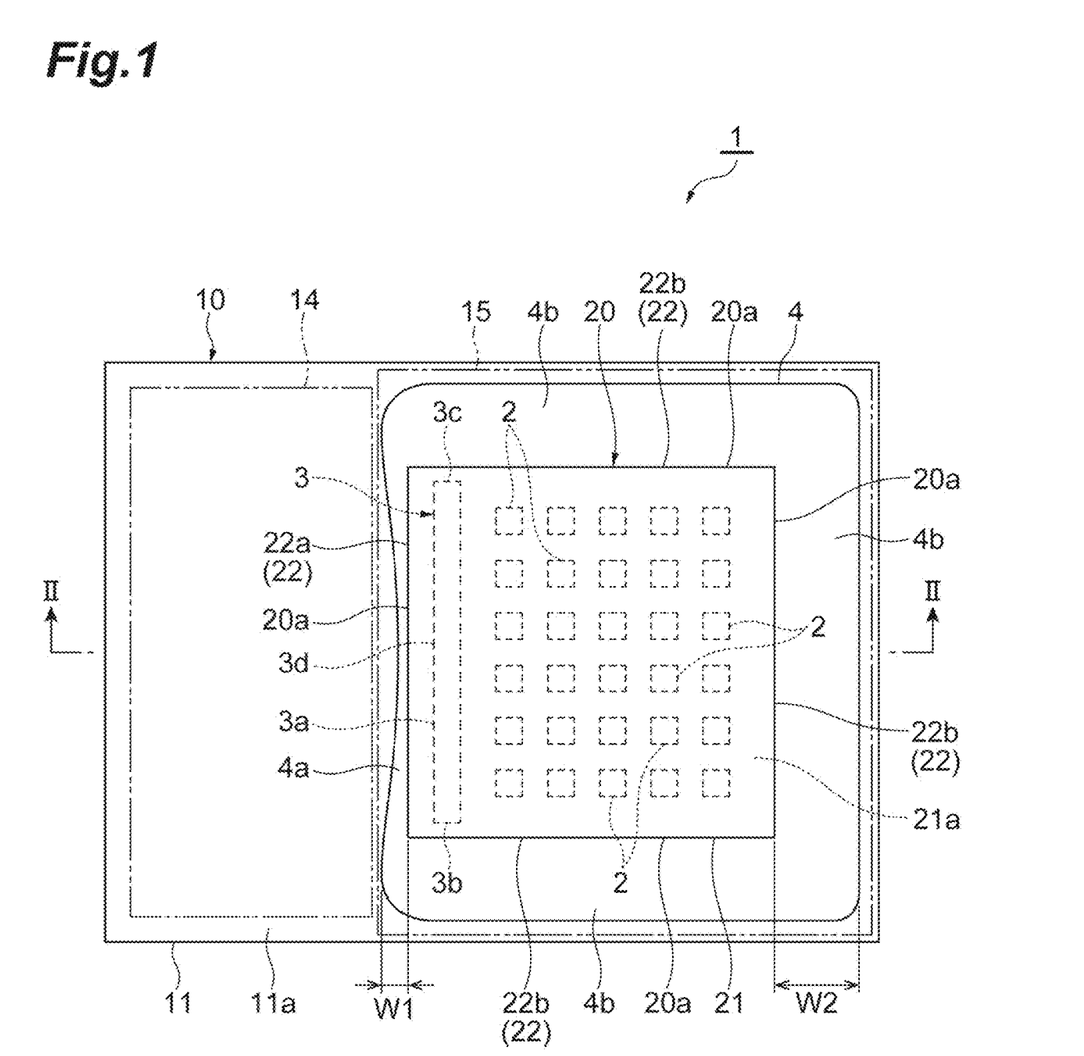
FIG. 1 is a plan view of a semiconductor device according to an embodiment.
Figure 2:
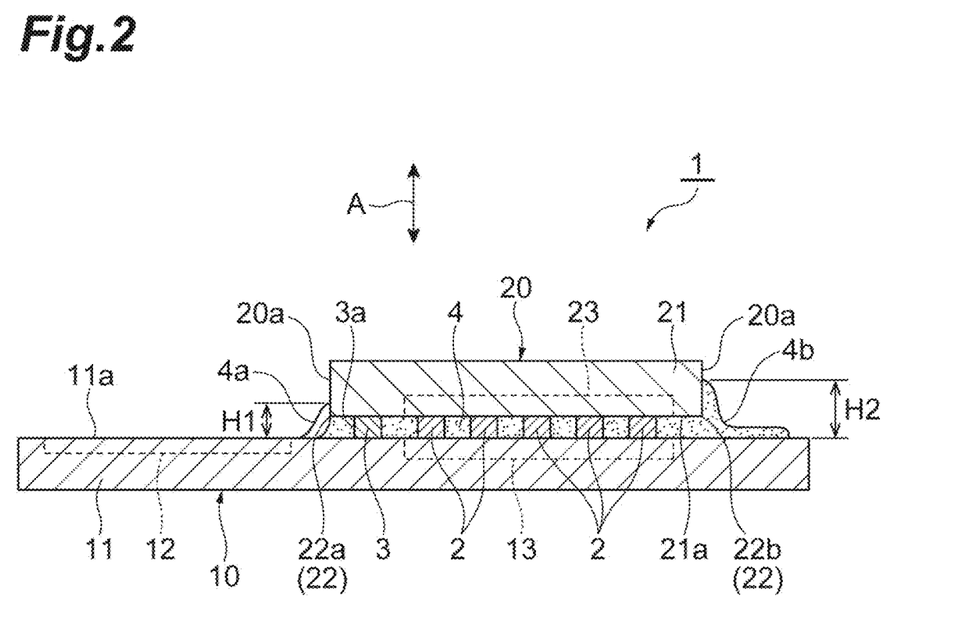
FIG. 2 is a cross-sectional view of the semiconductor device illustrated in FIG. 1 along line II-II.

As illustrated in FIGS. 1 and 2, a semiconductor device 1 includes a first semiconductor chip (support body) 10 and a second semiconductor chip (semiconductor chip) 20. For example, the first semiconductor chip 10 is an image sensor. For example, the second semiconductor chip 20 is a readout integrated circuit (ROIC). The first semiconductor chip 10 and the second semiconductor chip 20 are joined to each other through flip-chip bonding.

The first semiconductor chip 10 is a semiconductor chip in which a light receiving portion 12 and a circuit portion 13 are fabricated in a part on a semiconductor substrate 11 on a front surface 11a side. The light receiving portion 12 includes a plurality of pixels. The circuit portion 13 includes a plurality of electrode pads provided on the front surface 11a. The corresponding pixels and electrode pads are electrically connected to each other through wirings fabricated on the semiconductor substrate 11. Each of the electrode pads may include under-bump metal.

A light receiving region 14 and a mount region 15 are provided on the front surface 11a of the semiconductor substrate 11. The light receiving region 14 is a region corresponding to the light receiving portion 12. The mount region 15 is a region corresponding to the circuit portion 13. The light receiving region 14 is adjacent to the mount region 15. As an example, the semiconductor substrate 11 is formed to have a rectangular plate shape (for example, a rectangular plate shape of approximately 20 mm×15 mm×1 mm (thickness)), and the rectangular light receiving region 14 is adjacent to the rectangular mount region 15 on the rectangular front surface 11a.

The second semiconductor chip 20 is a semiconductor chip in which a circuit portion 23 is fabricated in a part of a semiconductor substrate 21 on a front surface 21a side. The circuit portion 23 includes a plurality of electrode pads provided on the front surface 21a. As an example, the semiconductor substrate 21 is formed to have a rectangular plate shape (for example, a rectangular plate shape of approximately 10 mm×10 mm×1 mm (thickness)). Each of the electrode pads may include under-bump metal.

The second semiconductor chip 20 is disposed on the mount region 15 of the first semiconductor chip 10 with a predetermined distance (for example, approximately 5 μm) therebetween in a state in which the front surface 11a of the semiconductor substrate 11 and the front surface 21a of the semiconductor substrate 21 face each other. In a direction A in which the first semiconductor chip 10 and the second semiconductor chip 20 face each other (which will hereinafter be simply referred to as "a direction A"), a plurality of electrode pads provided on the front surface 11a of the semiconductor substrate 11 and a plurality of electrode pads provided on the front surface 21a of the semiconductor substrate 21 face each other in one to one correspondence. The electrode pads facing each other are electrically and physically connected to each other through bumps 2. For example, the height and the width of each bump 2 are approximately 5 μm, for example, and a distance between the centers of the adjacent bumps 2 is approximately 20 μm.

In addition to a plurality of bumps 2, one wall portion 3 is disposed between the first semiconductor chip 10 and the second semiconductor chip 20. For example, the height and the width of the wall portion 3 are approximately 5 μm. The first semiconductor chip 10 and the second semiconductor chip 20 are joined to each other with the plurality of bumps 2 and one wall portion 3. That is, the wall portion 3 abuts the first semiconductor chip 10 and the second semiconductor chip 20. The material of the wall portion 3 is the same as the materials of the bumps 2 (for example, SnAg, SnAgCu, SnBi, and In). However, the wall portion 3 is physically connected to each of the first semiconductor chip 10 and the second semiconductor chip 20 but is not electrically connected to each of the first semiconductor chip 10 and the second semiconductor chip 20.

The wall portion 3 is disposed along a part 22a of an outer edge 22 of the second semiconductor chip 20. The outer edge 22 is an outer edge of the second semiconductor chip 20 when viewed in the direction A. The outer edge 22 is included in the outer edge of the mount region 15 of the first semiconductor chip 10 when viewed in the direction A. The part 22a of the outer edge 22 is a part extending along the light receiving region 14 when viewed in the direction A. As an example, the part 22a of the outer edge 22 is one side of the rectangular outer edge 22 on the light receiving region 14 side when viewed in the direction A and extends along one side of the rectangular light receiving region 14 on the mount region 15 side.

An outer side surface 3a (which will hereinafter be simply referred to as "a side surface 3a") of the wall portion 3 is positioned on an inward side of the part 22a of the outer edge 22 of the second semiconductor chip 20 when viewed in the direction A. The distance between the part 22a of the outer edge 22 and the side surface 3a of the wall portion 3 when viewed in the direction A is within a range of approximately 10 to 100 μm. The outward side is a side on which the outer edge 22 of the second semiconductor chip 20 is positioned with respect to the center (center of gravity) of the second semiconductor chip 20 when viewed in the direction A, and the inward side is a side on which the center (center of gravity) of the second semiconductor chip 20 is positioned with respect to the outer edge 22 of the second semiconductor chip 20 when viewed in the direction A.

An underfill resin layer 4 is disposed between the first semiconductor chip 10 and the second semiconductor chip 20. The underfill resin layer 4 covers the entire side surface 3a of the wall portion 3. In a part of the underfill resin layer 4 covering the side surface 3a of the wall portion 3, the width (width in a direction perpendicular to the side surface 3a) of the part decreases toward a central portion 3d on the side surface 3a of the wall portion 3 from each of one end portion 3b and the other end portion 3c of the wall portion 3 when viewed in the direction A. However, the width of the part may be substantially uniform when viewed in the direction A.

A first fillet portion 4a and a second fillet portion 4b are provided at an outer edge of the underfill resin layer 4. The first fillet portion 4a is a part disposed in the mount region 15 of the first semiconductor chip 10 on the outward side of the part 22a along the part 22a of the outer edge 22 of the second semiconductor chip 20. The second fillet portion 4b is a part disposed in the mount region 15 of the first semiconductor chip 10 on the outward side of a remaining part 22b of the outer edge 22 of the second semiconductor chip 20 excluding the part 22a along the remaining part 22b.

The first fillet portion 4a and the second fillet portion 4b lead to a side surface 20a of the second semiconductor chip 20 (that is, a side surface of the semiconductor substrate 21). The height (height from the mount region 15) of each of the first fillet portion 4a and the second fillet portion 4b decreases toward the outward side. A height H1 of the first fillet portion 4a is shorter than a height H2 of the second fillet portion 4b. A width W1 of the first fillet portion 4a is narrower than a width W2 of the second fillet portion 4b. The heights H1 and H2 are the maximum values for the height from the mount region 15. The widths W1 and W2 are the maximum value for the width protruding to the outward side from the side surface 20a of the second semiconductor chip 20 when viewed in the direction A.

[Method for Manufacturing Semiconductor Device]

Figure 3:
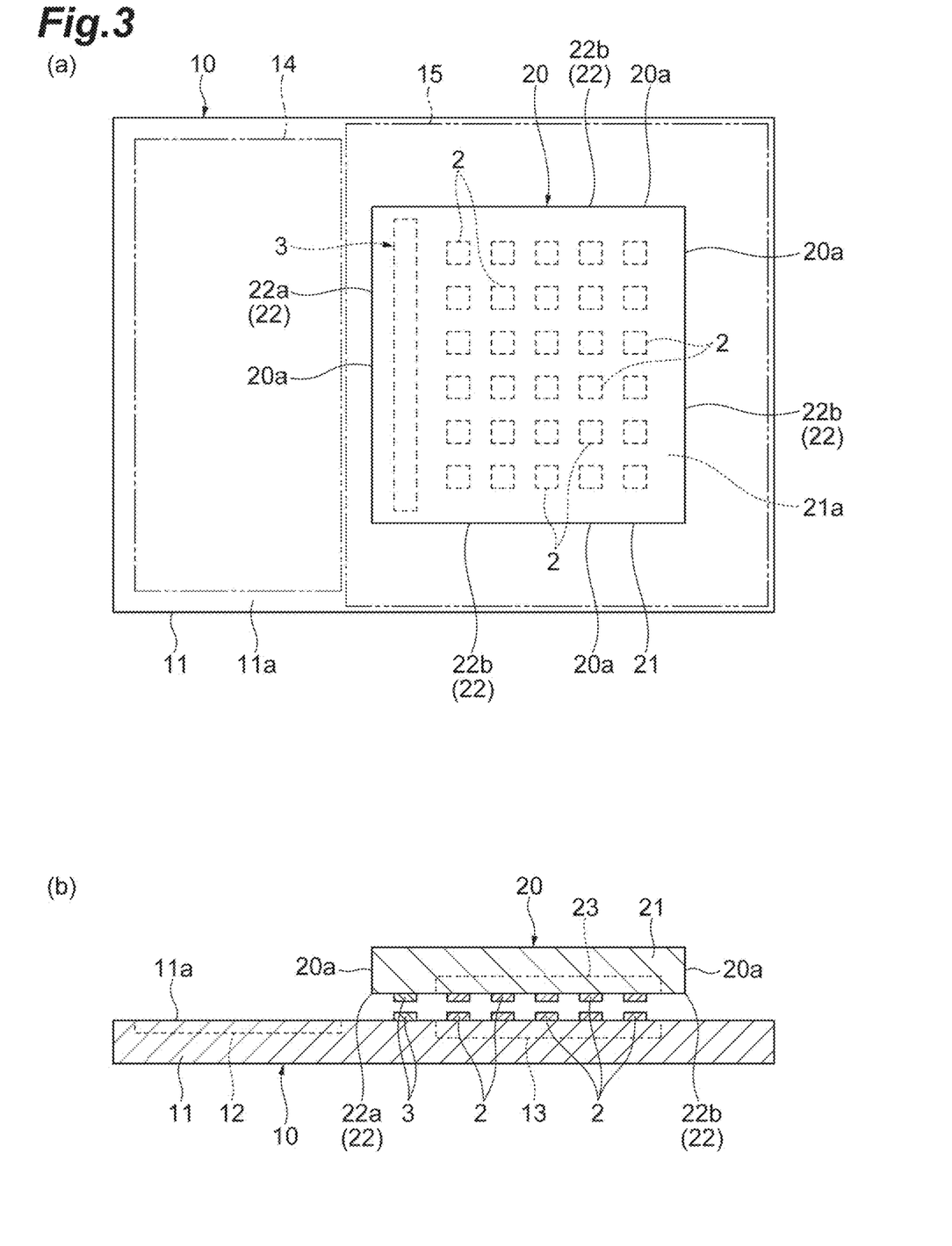
Figure 4:
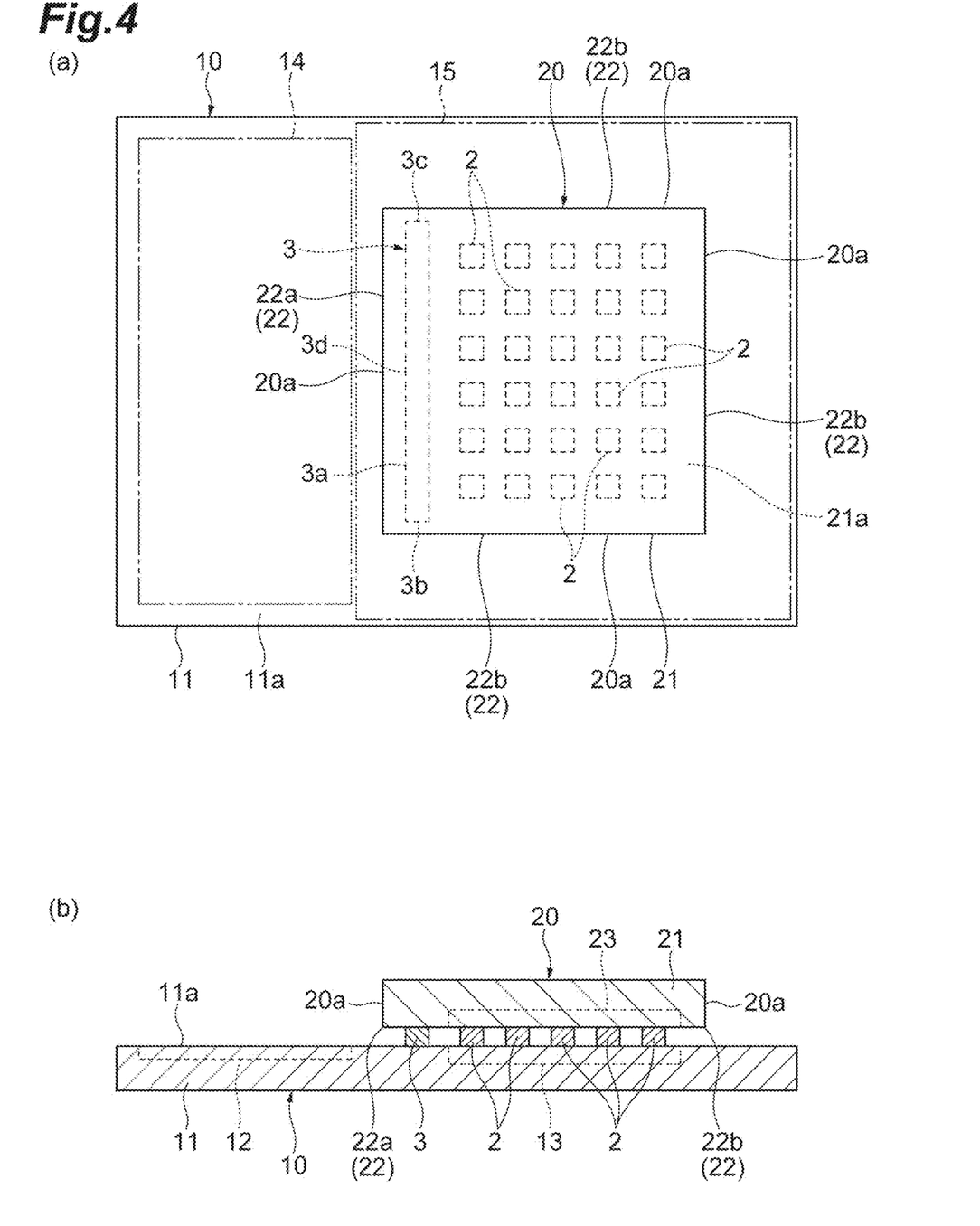

As illustrated in FIG. 3, the first semiconductor chip 10 provided with a portion of each bump 2 and a portion of the wall portion 3 and the second semiconductor chip 20 provided with a portion of each bump 2 and a portion of the wall portion 3 are prepared. Subsequently, the second semiconductor chip 20 is disposed on the mount region 15 of the first semiconductor chip 10 with a predetermined distance therebetween. Portions of the corresponding bumps 2 are brought into contact with each other and portions of the wall portions 3 are brought into contact with each other. Subsequently, as illustrated in FIG. 4, portions of the corresponding bumps 2 are integrated with each other and portions of the wall portions 3 are integrated with each other through heating. The first semiconductor chip 10 and the second semiconductor chip 20 are joined to each other with the plurality of bumps 2 and one wall portion 3 (first step).

Figure 5:
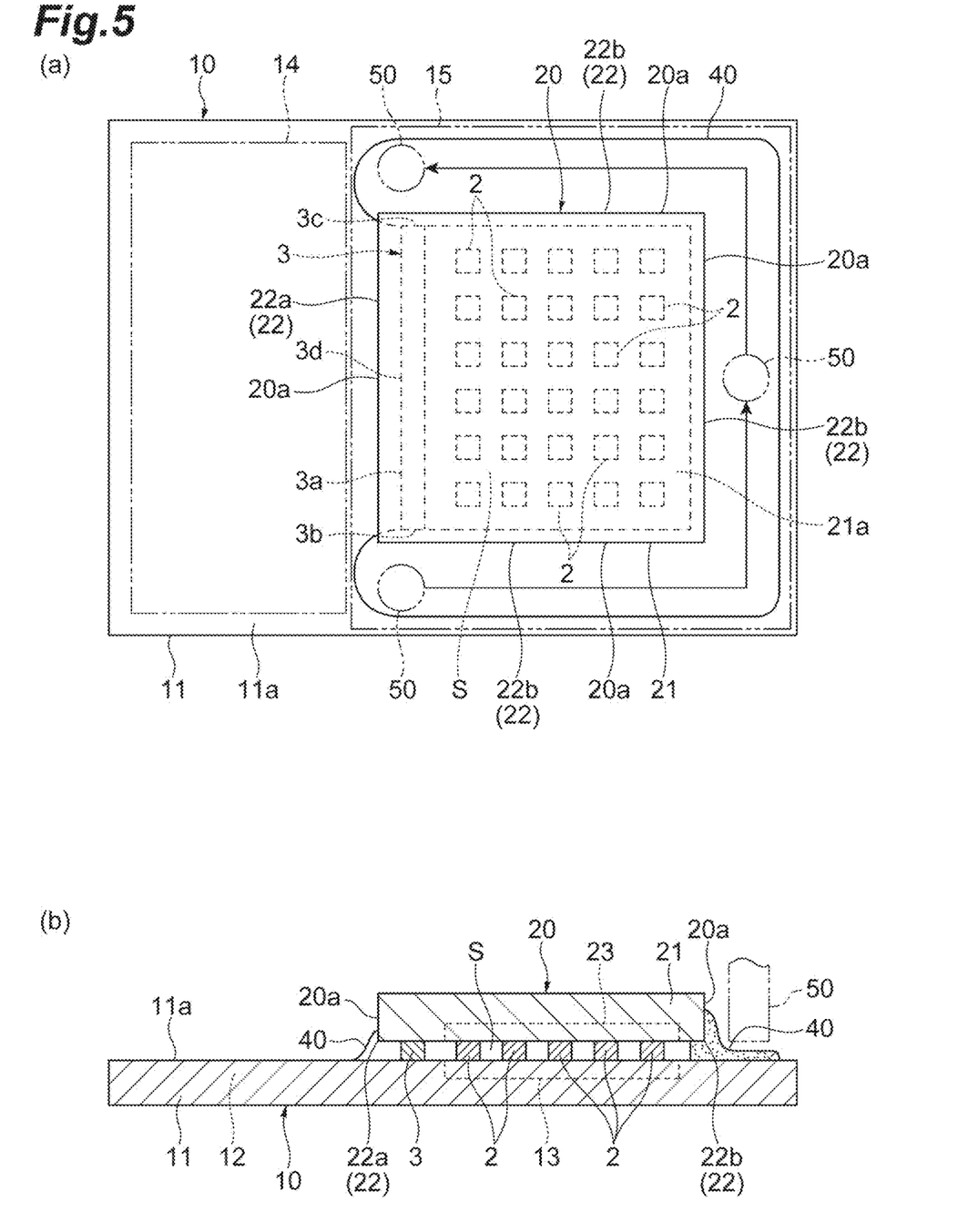

Subsequently, the underfill resin layer 4 is disposed between the first semiconductor chip 10 and the second semiconductor chip 20 by a vacuum filling method. That is, as illustrated in FIG. 5, in a vacuum environment (environment of a pressure lower than atmospheric pressure maintaining a predetermined degree of vacuum) (environment of a first atmospheric pressure), an underfill resin agent 40 is supplied to the mount region 15 of the first semiconductor chip 10 along the remaining part 22b of the outer edge 22 of the second semiconductor chip 20 such that a part in the vicinity of the one end portion 3b of the wall portion 3 becomes a starting point and a part in the vicinity of the other end portion 3c of the wall portion 3 becomes an ending point. Supply of this underfill resin agent 40 is performed by causing a dispenser 50 to travel. Accordingly, in a vacuum environment, the underfill resin agent 40 is disposed in the mount region 15 on the outward side of the remaining part 22b along the remaining part 22b of the outer edge 22, and a closed space S is formed between the first semiconductor chip 10 and the second semiconductor chip 20 with the wall portion 3 and the underfill resin agent 40 (second step).

There is a need for the starting point for supplying the underfill resin agent 40 to be in the vicinity of the end portion 3b to an extent that the underfill resin agent 40 reaches the one end portion 3b of the wall portion 3 due to a capillary phenomenon. Similarly, there is a need for the ending point for supplying the underfill resin agent 40 to be in the vicinity of the end portion 3c to an extent that the underfill resin agent 40 reaches the other end portion 3c of the wall portion 3 due to a capillary phenomenon. The distance between the starting point for supplying the underfill resin agent 40 and the one end portion 3b of the wall portion 3 and the distance between the ending point for supplying the underfill resin agent 40 and the other end portion 3c of the wall portion 3 are set on the basis of the distance between the first semiconductor chip 10 and the second semiconductor chip 20, the viscosity of the underfill resin agent 40, and the like. If each of the shortest distance between the one end portion 3b of the wall portion 3 and the outer edge 22 of the second semiconductor chip 20 and the shortest distance between the other end portion 3c of the wall portion 3 and the outer edge 22 of the second semiconductor chip 20 is within a range of approximately 10 to 100 μm (approximately less than 20 times the distance between the first semiconductor chip 10 and the second semiconductor chip 20), the underfill resin agent 40 can reach the one end portion 3b and the other end portion 3c of the wall portion 3 due to a capillary phenomenon, and thus the closed space S can be formed. In addition, an intersecting part of an annular region of the mount region 15 along the outer edge 22 of the second semiconductor chip 20 and an extended line of the side surface 3a of the wall portion 3 on the one end portion 3b side of the wall portion 3 is set as the starting point for supplying the underfill resin agent 40 when viewed in the direction A, and an intersecting part of an annular region of the mount region 15 along the outer edge 22 of the second semiconductor chip 20 and an extended line of the side surface 3a of the wall portion 3 on the other end portion 3b side of the wall portion 3 is set as the ending point for supplying the underfill resin agent 40 when viewed in the direction A. Consequently, in a third step which will be described below, a portion of the underfill resin agent 40 is likely to move forward from each of the one end portion 3b and the other end portion 3c of the wall portion 3 to the central portion 3d on the side surface 3a of the wall portion 3 along the side surface 3a of the wall portion 3.

Figure 6:
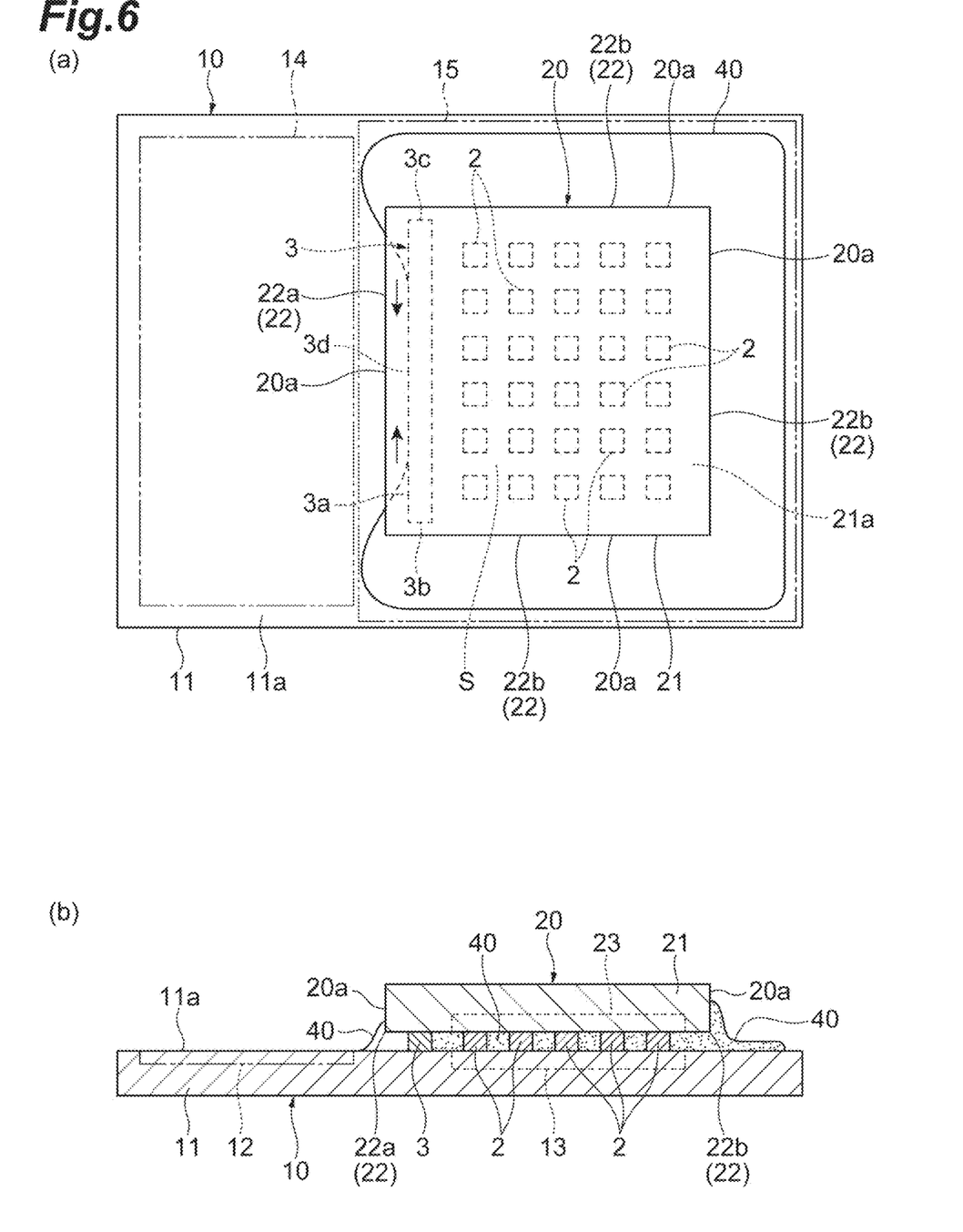

Subsequently, a vacuum environment is canceled and the first semiconductor chip 10 and the second semiconductor chip 20 are released under atmospheric pressure. Therefore, the first semiconductor chip 10 and the second semiconductor chip 20 in which the closed space S is formed with the wall portion 3 and the underfill resin agent 40 are disposed in an atmospheric pressure environment. Due to this disposition in an atmospheric pressure environment (disposition in an environment of a second atmospheric pressure higher than the first atmospheric pressure), as illustrated in FIG. 6, a region corresponding to the closed space S is filled with the underfill resin agent 40. At this time, a portion of the underfill resin agent 40 moves forward from each of the one end portion 3b and the other end portion 3c of the wall portion 3 to the central portion 3d on the side surface 3a of the wall portion 3 along the side surface 3a of the wall portion 3, thereby covering the entire side surface 3a. The underfill resin agent 40 moves forward to the region corresponding to the closed space S due to a pressure difference between the inside and the outside of the closed space S, and the underfill resin agent 40 moves forward along the side surface 3a of the wall portion 3 due to a capillary phenomenon. Subsequently, the underfill resin layer 4 is formed by hardening the underfill resin agent 40, and the underfill resin layer 4 is disposed between the first semiconductor chip 10 and the second semiconductor chip 20 (third step). A portion of the underfill resin agent 40 may move forward along the side surface 3a of the wall portion 3 due to a capillary phenomenon when the underfill resin agent 40 is subjected to heat hardening. As described above, the semiconductor device 1 is manufactured.

[Operation and Effects]

In the semiconductor device 1, for example, when a vacuum filling method is used during manufacturing, the closed space S can be formed between the first semiconductor chip 10 and the second semiconductor chip 20 with the wall portion 3 disposed along the part 22a of the outer edge 22 of the second semiconductor chip 20 and the underfill resin agent 40 disposed along the remaining part 22b of the outer edge 22 of the second semiconductor chip 20. Accordingly, there is no need to widen the mount region 15 of the first semiconductor chip 10 along the part 22a of the outer edge 22 of the second semiconductor chip 20. Therefore, in the semiconductor device 1, reliable disposition of the underfill resin layer 4 and size reduction of the device are realized. Moreover, in the semiconductor device 1, since the underfill resin layer 4 covers the entire side surface 3a of the wall portion 3, curbing of deterioration in the wall portion 3 and improvement in joining strength (for example, resistance to impact or the like) between the first semiconductor chip 10 and the second semiconductor chip 20 are realized. As described above, according to the semiconductor device 1, improvement in reliability and size reduction are achieved.

In addition, in the semiconductor device 1, the part 22a of the outer edge 22 of the second semiconductor chip 20 is a part extending in the outer edge 22 of the second semiconductor chip 20 along the light receiving region 14. Due to this configuration, while the underfill resin layer 4 is prevented from protruding above the light receiving region 14, the second semiconductor chip 20 and the light receiving region 14 can be disposed close to each other. The second semiconductor chip 20 and the light receiving region 14 disposed close to each other contribute to not only size reduction of the device but also curbing of occurrence of noise caused by the shortened wiring length between the light receiving portion 12 and the circuit portion 13.

In addition, in the semiconductor device 1, the material of the wall portion 3 is the same as the material of the bumps 2. Due to this configuration, damage or the like caused by the difference between thermal expansion coefficients of the bumps 2 and the wall portion 3 is curbed. In addition, the bumps 2 and the wall portion 3 are easily formed. For example, in the first step of the method for manufacturing the semiconductor device 1 described above, formation of a portion of each bump 2 in each of the first semiconductor chip 10 and the second semiconductor chip 20 and formation of a portion of the wall portion 3 can be performed at the same time (in the same step), and integration of portions of the corresponding bumps 2 and integration of portions of the wall portions 3 can be performed at the same time (in the same step).

In addition, in the semiconductor device 1, the side surface 3a of the wall portion 3 is positioned on an inward side of the part 22a of the outer edge 22 of the second semiconductor chip 20 when viewed in the direction A. Due to this configuration, a groove having the side surface 3a of the wall portion 3 as a bottom surface is formed along the part 22a of the outer edge 22. Therefore, a part of the underfill resin layer 4 covering the side surface 3a of the wall portion 3 is stabilized, and a protruding amount of the part contributing to size reduction is further reduced. In addition, since a groove having the side surface 3a of the wall portion 3 as a bottom surface is formed along the part 22a of the outer edge 22, the underfill resin agent 40 is likely to move forward along the side surface 3a of the wall portion 3 due to a capillary phenomenon, for example, in the third step of the method for manufacturing the semiconductor device 1 described above. Moreover, for example, in the first step of the method for manufacturing the semiconductor device 1 described above, when a portion of each bump 2 and a portion of the wall portion 3 are formed in the second semiconductor chip 20 in a state in which a plurality of second semiconductor chips 20 are present as a wafer, and when the wafer is diced into a plurality of second semiconductor chips 20 thereafter, damage to a portion of the wall portion 3 due to dicing can be reliably prevented.

In addition, in the semiconductor device 1, the underfill resin layer 4 includes the first fillet portion 4a disposed along the part 22a of the outer edge 22 of the second semiconductor chip 20 and the second fillet portion 4b disposed along the remaining part 22b of the outer edge 22 of the second semiconductor chip 20, and the width of the first fillet portion 4a is narrower than the width of the second fillet portion 4b. Due to this configuration, while size reduction of the device is maintained, improvement in joining balance and joining strength between the first semiconductor chip 10 and the second semiconductor chip 20 is realized.

In addition, in the semiconductor device 1, the first fillet portion 4a and the second fillet portion 4b leads to the side surface 20a of the second semiconductor chip 20. Due to this configuration, improvement in joining balance and joining strength between the first semiconductor chip 10 and the second semiconductor chip 20 is realized more reliably.

In addition, in the method for manufacturing the semiconductor device 1, the closed space S is formed between the first semiconductor chip 10 and the second semiconductor chip 20 with the wall portion 3 disposed along the part 22a of the outer edge 22 of the second semiconductor chip 20 and the underfill resin agent 40 disposed along the remaining part 22b of the outer edge 22 of the second semiconductor chip 20. Accordingly, there is no need to widen the mount region 15 of the first semiconductor chip 10 along the part 22a of the outer edge 22 of the second semiconductor chip 20. Specifically, since the dispenser 50 travels along the remaining part 22b of the outer edge 22 of the second semiconductor chip 20, there is a need to widen the mount region 15 to be equal to or larger than the diameter (for example, approximately 400 µm) of the dispenser 50. In contrast, since the dispenser 50 does not travel along the part 22a of the outer edge 22 of the second semiconductor chip 20, there is no need to widen the mount region 15 of the first semiconductor chip 10. Thus, according to the method for manufacturing the semiconductor device 1, it is possible to obtain the semiconductor device 1 in which improvement in reliability and size reduction of the device are realized.

A vacuum filling method which is a technique for forming the underfill resin layer 4 is becoming more important as chip structures become higher in definition. In accordance with the chip structures becoming higher in definition, the distance between the centers of the adjacent bumps 2 is reduced to approximately 20 µm, for example, and in order to realize this, the height and the width of each bump 2 are reduced to approximately 5 µm, for example. Accordingly, the distance between the first semiconductor chip 10 and the second semiconductor chip 20 also becomes shorter to approximately 5 µm, for example. In such a case, it is difficult for the underfill resin agent 40 to move forward between the first semiconductor chip 10 and the second semiconductor chip 20 with only a capillary phenomenon (particularly, it is difficult to fill the central part). Therefore, it is preferable to adopt a vacuum filling method in which the underfill resin agent 40 is moved forward between the first semiconductor chip 10 and the second semiconductor chip 20 due to the pressure difference between the inside and the outside of the closed space S. However, when a closed space is formed with the annular underfill resin agent 40, in order to cause the dispenser 50 to travel annularly along the entire part of the outer edge 22 of the second semiconductor chip 20, the mount region 15 of the first semiconductor chip 10 has to be widened. Here, the configuration of the semiconductor device 1 and the method for manufacturing the semiconductor device 1, in which there is no need to widen the mount region 15 of the first semiconductor chip 10 along the part 22a by disposing the wall portion 3 along the part 22a of the outer edge 22 of the second semiconductor chip 20, are extremely effective in realizing reliable disposition of the underfill resin layer 4 and size reduction of the device.

Modification Example

The present disclosure is not limited to the embodiment described above. For example, each of the configurations in the embodiment described above is not limited to the material and the shape described above, and various materials and shapes can be applied. In addition, each of the configurations in the embodiment described above or a modification example thereof can be arbitrarily applied to each of the configurations in another embodiment or a modification example thereof.

Figure 7:
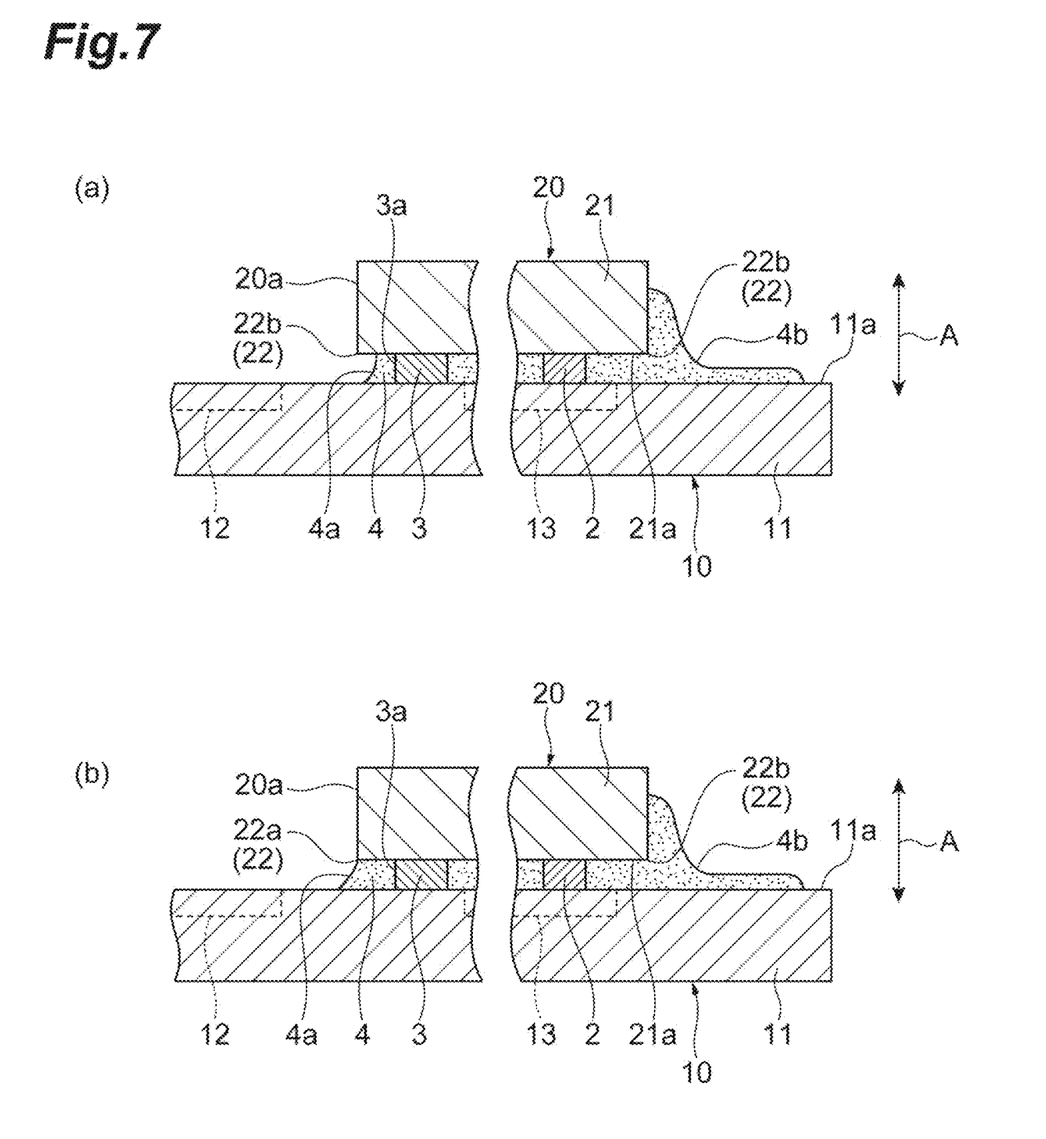

In addition, as illustrated in (a) of FIG. 7, a part of the underfill resin layer 4 along the side surface 3a of the wall portion 3 may be settled inside a groove having the side surface 3a of the wall portion 3 as a bottom surface. In addition, as illustrated in FIG. (b) of 7, the first fillet portion 4a does not have to lead to the side surface 20a of the second semiconductor chip 20. In addition, the underfill resin layer 4 does not have to cover the entire side surface 3a of the wall portion 3. For example, the underfill resin layer 4 may cover only a part on the side surface 3a of the wall portion 3 excluding the central portion 3d (refer to (a) of FIG. 6). If the underfill resin layer 4 covers a portion on the side surface 3a of the wall portion 3, curbing of deterioration in the wall portion 3 and improvement in joining strength between the first semiconductor chip 10 and the second semiconductor chip 20 are realized.

In addition, the side surface 3a of the wall portion 3 may be positioned on the part 22a of the outer edge 22 of the second semiconductor chip 20 when viewed in the direction A. That is, the wall portion 3 may be disposed between the first semiconductor chip 10 and the second semiconductor chip 20 such that the side surface 3a becomes flush with the side surface 20a of the second semiconductor chip 20. In addition, the material of the wall portion 3 does not have to be the same as the material of the bumps 2. As an example, the material of the bumps 2 is SnAgCu, whereas the material of the wall portion 3 may be polyimide. In this manner, not only a metal material but also a resin material may be used as a material of the wall portion 3.

Figure 8:
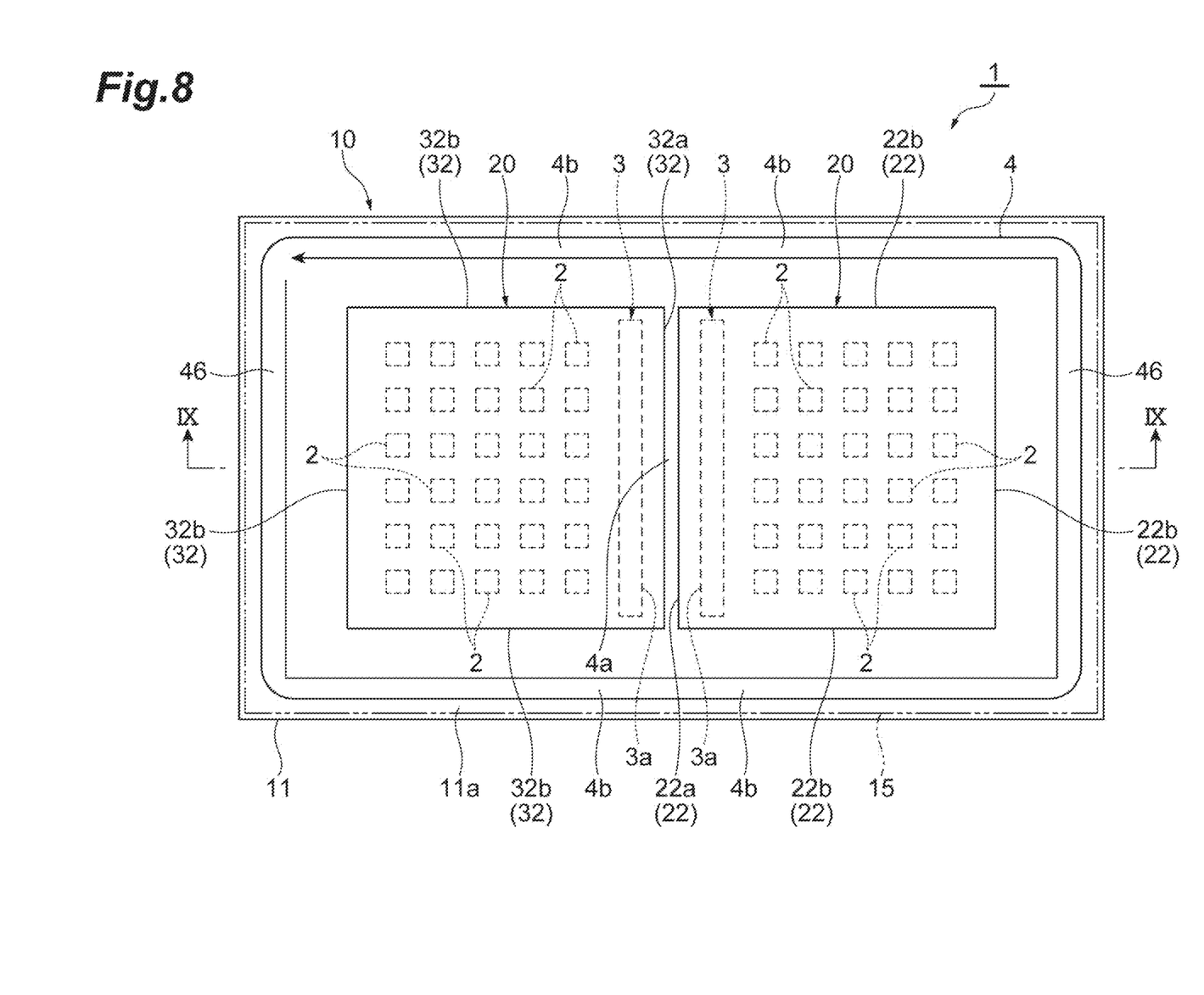
FIG. 8 is a plan view of the semiconductor device according to another embodiment.
Figure 9:
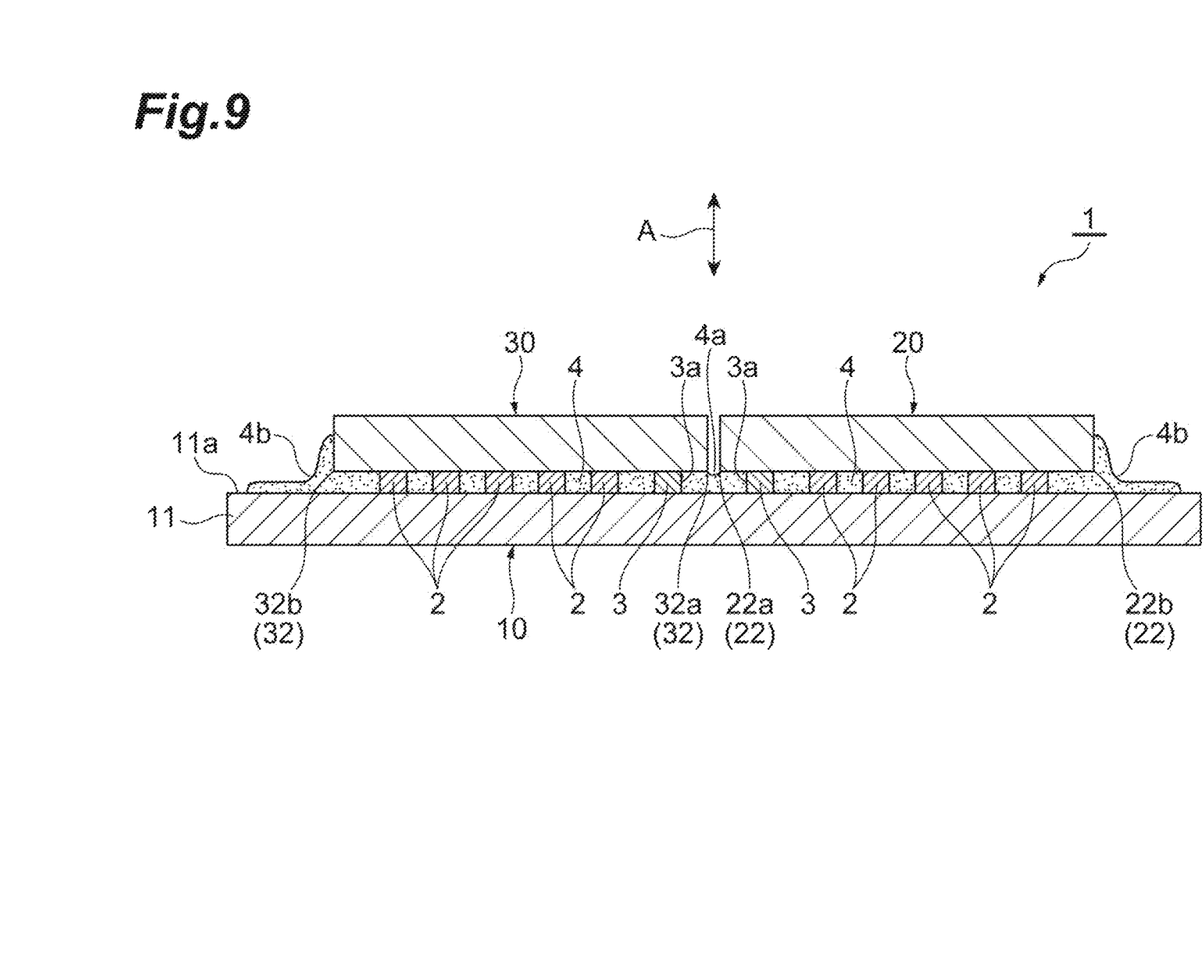
FIG. 9 is a cross-sectional view of the semiconductor device illustrated in FIG. 8 along line IX-IX.

In addition, as illustrated in FIGS. 8 and 9, in the semiconductor device 1, the second semiconductor chip 20 and a third semiconductor chip (different semiconductor chip) 30 adjacent to each other may be mounted in the mount region 15 of the first semiconductor chip 10 through flip-chip bonding. In this semiconductor device 1, the wall portion 3 is disposed between the first semiconductor chip 10 and the second semiconductor chip 20 along the part 22a of the outer edge 22 of the second semiconductor chip 20, and the wall portion 3 is disposed between the first semiconductor chip 10 and the third semiconductor chip 30 along a part 32a of an outer edge 32 of the third semiconductor chip 30. The part 22a of the outer edge 22 is a part extending along the third semiconductor chip 30 when viewed in the direction A. The part 32a of the outer edge 32 is a part extending along the second semiconductor chip 20 when viewed in the direction A. In this semiconductor device 1, the underfill resin layer 4 continuously disposed between the first semiconductor chip 10 and the second semiconductor chip 20, between the first semiconductor chip 10 and the third semiconductor chip 30, and between the side surfaces 3a of the wall portion 3 facing each other. According to this semiconductor device 1, the second semiconductor chip 20 and the third semiconductor chip 30 can be disposed close to each other.

In the semiconductor device 1 illustrated in FIGS. 8 and 9, the underfill resin layer 4 can be formed by annularly disposing the underfill resin agent 40 in the mount region 15 of the first semiconductor chip 10 along a remaining part 23b of the outer edge 22 of the second semiconductor chip 20 and a remaining part 32b of the outer edge 32 of the third semiconductor chip 30 in a vacuum filling method. The reason is that the closed spaces S are formed respectively between the first semiconductor chip 10 and the second semiconductor chip 20 and between the first semiconductor chip 10 and the third semiconductor chip 30 with the wall portion 3 and the underfill resin agent 40. For example, such disposition of the underfill resin agent 40 is performed by causing the dispenser 50 to travel as indicated by the arrow in FIG. 8. The underfill resin agent 40 moves forward due to a capillary phenomenon between the side surfaces 3a of the wall portion 3 facing each other.

Figure 10:
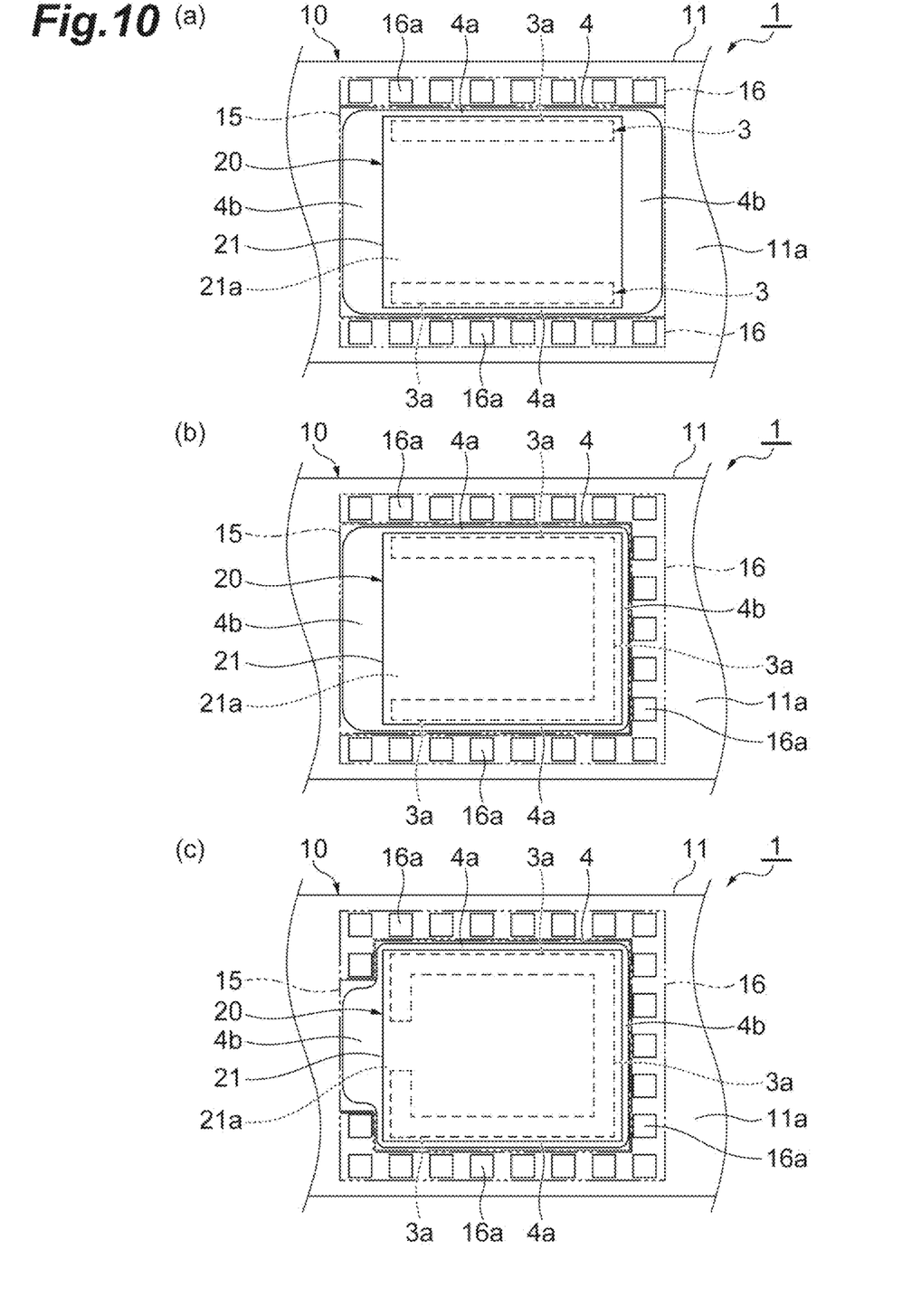

In addition, as illustrated in (a), (b), and (c) of FIG. 10, in the semiconductor device 1, the first semiconductor chip 10 may have the mount region 15 and a terminal region 16 adjacent to each other. The terminal region 16 is a region in which a plurality of terminals 16a are provided on the front surface 11a of the semiconductor substrate 11. In this semiconductor device 1, the wall portion 3 is disposed between the first semiconductor chip 10 and the second semiconductor chip 20 along the part 22a of the outer edge 22 of the second semiconductor chip 20. The part 22a of the outer edge 22 is a part extending along the terminal region 16 when viewed in the direction A. This semiconductor device 1 mainly differs from the semiconductor device 1 illustrated in FIGS. 1 and 2 in that the terminal region 16 is provided in the first semiconductor chip 10 in place of the light receiving region 14. According to this semiconductor device 1, while the underfill resin layer 4 is prevented from protruding above the terminal region 16, the second semiconductor chip 20 and the terminal region 16 can be disposed close to each other. In (a), (b), and (c) of FIG. 10, illustration of the bumps 2 is omitted.

As illustrated in (a) of FIG. 10, the wall portion 3 may be disposed between the first semiconductor chip 10 and the second semiconductor chip 20 along each of the parts 22a of a plurality of outer edge 22 which are separated from each other. That is, a plurality of wall portions 3 may be disposed between the first semiconductor chip 10 and the second semiconductor chip 20. The same applies to the semiconductor device 1 illustrated in FIGS. 1 and 2 and the semiconductor device 1 illustrated in FIGS. 8 and 9 as well. In addition, as illustrated in (b), and (c) of FIG. 10, the length of the part 22a of the outer edge 22 may be shorter than the length of the remaining part 22b of the outer edge 22. In addition, the wall portion 3 is not limited to a wall portion which extends linearly. For example, a bent wall portion may be adopted. The same applies to the semiconductor device 1 illustrated in FIGS. 1 and 2 and the semiconductor device 1 illustrated in FIGS. 8 and 9 as well.

In the semiconductor device 1 described above, the support body of the present disclosure serves as the first semiconductor chip 10, but the support body of the present disclosure is not limited thereto. The support body of the present disclosure need only be a support body having a mount region. For example, a wiring substrate, an electronic component, or the like may be adopted.

In the method for manufacturing the semiconductor device 1 described above, the second step is performed in a vacuum environment and the third step is performed in an atmospheric pressure environment. However, if the second step is performed in an environment of the first atmospheric pressure and the third step is performed in an environment of the second atmospheric pressure higher than the first atmospheric pressure, the underfill resin agent 40 can move forward into the closed space S due to the pressure difference between the inside and the outside of the closed space S formed with the wall portion 3 and the underfill resin agent 40.

REFERENCE SIGNS LIST

1: semiconductor device, 2: bump, 3: wall portion, 3a: outer side surface, 4: underfill resin layer, 4a: first fillet portion, 4b: second fillet portion, 10: first semiconductor chip (support body), 14: light receiving region, 15: mount region, 16: terminal region, 20: second semiconductor chip (semiconductor chip), 20a: side surface, 22: outer edge, 22a: part, 22b: remaining part, 30: third semiconductor chip (different semiconductor chip), 40: underfill resin agent, S: closed space.

The invention claimed is:

1. A semiconductor device comprising:
a support body including a mount region;
a semiconductor chip disposed on the mount region with a predetermined distance therebetween;
a bump disposed between the support body and the semiconductor chip;

a wall portion disposed between the support body and the semiconductor chip along a part of an outer edge of the semiconductor chip; and an underfill resin layer disposed between the support body and the semiconductor chip, wherein the underfill resin layer covers an outer side surface of the wall portion, and wherein the wall portion has an elongated shape extending along the part of the outer edge of the semiconductor chip.

2. The semiconductor device according to claim 1,
wherein the underfill resin layer covers the entire outer side surface of the wall portion.

3. The semiconductor device according to claim 1,
wherein a material of the wall portion is the same as a material of the bump.

4. The semiconductor device according to claim 1,
wherein the outer side surface of the wall portion is positioned on an inward side of the part of the outer edge of the semiconductor chip when viewed in a direction in which the support body and the semiconductor chip face each other.

5. The semiconductor device according to claim 1,
wherein the underfill resin layer includes
  a first fillet portion disposed on the mount region along the part of the outer edge of the semiconductor chip, the first fillet portion being positioned on an outward side of the part, and
  a second fillet portion disposed on the mount region along a remaining part of the outer edge of the semiconductor chip excluding the part, the second fillet portion being positioned on an outward side of the remaining part, and
wherein a width of the first fillet portion is narrower than a width of the second fillet portion.

6. The semiconductor device according to claim 5,
wherein the first fillet portion and the second fillet portion lead to a side surface of the semiconductor chip.

7. The semiconductor device according to claim 1,
wherein the support body further includes a light receiving region adjacent to the mount region, and
wherein the part of the outer edge of the semiconductor chip is a part extending along the light receiving region.

8. The semiconductor device according to claim 1 further comprising:
  a different semiconductor chip adjacent to the semiconductor chip in the mount region,
wherein the part of the outer edge of the semiconductor chip is a part extending along the different semiconductor chip.

9. The semiconductor device according to claim 1,
wherein the support body further includes a terminal region adjacent to the mount region, and
wherein the part of the outer edge of the semiconductor chip is a part extending along the terminal region.

10. A method for manufacturing the semiconductor device of claim 1, the method comprising:
  a first step of disposing the semiconductor chip on the mount region included in the support body with the predetermined distance therebetween, and joining the support body and the semiconductor chip to each other with the bump disposed between the support body and the semiconductor chip and the wall portion disposed between the support body and the semiconductor chip along the part of the outer edge of the semiconductor chip;
  a second step of disposing an underfill resin agent on the mount region along a remaining part of the outer edge of the semiconductor chip excluding the part to be positioned on an outward side of the remaining part in an environment of a first atmospheric pressure, and forming a closed space between the support body and the semiconductor chip with the wall portion and the underfill resin agent; and
  a third step of filling a region corresponding to the closed space with the underfill resin agent by disposition in an environment of a second atmospheric pressure higher than the first atmospheric pressure, and disposing the underfill resin layer between the support body and the semiconductor chip by hardening the underfill resin agent.

* * * * *